US012690376B2

(12) United States Patent
Na et al.

(10) Patent No.: US 12,690,376 B2
(45) Date of Patent: Jul. 21, 2026

(54) DISPLAY APPARATUS WITH SENSOR-AREA BLACK PATTERNS ON THE CIRCUIT LAYER

(71) Applicant: Samsung Display Co., LTD., Yongin-si (KR)

(72) Inventors: Minjung Na, Seoul (KR); Jinsung An, Gwacheon-si (KR); Yongjae Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 487 days.

(21) Appl. No.: 18/204,227

(22) Filed: May 31, 2023

(65) Prior Publication Data

US 2024/0040918 A1 Feb. 1, 2024

(30) Foreign Application Priority Data

Aug. 1, 2022 (KR) ......................... 10-2022-0095494

(51) Int. Cl.
| | |
|---|---|
| *H10K 59/80* | (2023.01) |
| *H10K 59/122* | (2023.01) |
| *H10K 59/126* | (2023.01) |
| *H10K 59/40* | (2023.01) |

(52) U.S. Cl.
CPC ....... *H10K 59/8792* (2023.02); *H10K 59/122* (2023.02); *H10K 59/126* (2023.02); *H10K 59/40* (2023.02)

(58) Field of Classification Search
CPC ............. H10K 59/8792; H10K 59/122; H10K 59/126; H10K 50/865; H10K 50/86
See application file for complete search history.

(56) References Cited

U.S. PATENT DOCUMENTS

| | | |
|---|---|---|
| 11,210,492 B2 | 12/2021 | Yang et al. |
| 2014/0239270 A1 | 8/2014 | Ko et al. |
| 2020/0168691 A1* | 5/2020 | Choi .................... H10K 59/131 |

(Continued)

FOREIGN PATENT DOCUMENTS

| | | |
|---|---|---|
| KR | 100455395 B1 | 11/2004 |
| KR | 1020140108023 A | 9/2014 |

(Continued)

OTHER PUBLICATIONS

Office Action dated Mar. 21, 2026 from the Korean Intellectual Property Office (KIPO) for Korean Patent Application No. 10-2022-0095494, 14 pages (w/English-translation).

*Primary Examiner* — Chad M Dicke
*Assistant Examiner* — Jeremy Daniel Watts
(74) *Attorney, Agent, or Firm* — CANTOR COLBURN LLP

(57) ABSTRACT

A display device includes: a substrate including a display area and a sensor area surrounded by the display area, a circuit layer disposed on the substrate and including a plurality of pixel circuits, a plurality of display pixel electrodes disposed on the circuit layer and overlapping the display area, a plurality of sensor pixel electrodes disposed on the circuit layer and overlapping the sensor area, and a plurality of black patterns disposed on the circuit layer and overlapping the sensor pixel electrodes, respectively, where the black patterns cover boundary areas of the sensor pixel electrodes, respectively, and expose at least a portion of the circuit layer.

19 Claims, 11 Drawing Sheets

(56)         References Cited

U.S. PATENT DOCUMENTS

| | | | |
|---|---|---|---|
| 2021/0376007 A1* | 12/2021 | Choi | H10K 59/122 |
| 2022/0077430 A1* | 3/2022 | Choi | H10K 59/65 |

FOREIGN PATENT DOCUMENTS

| | | |
|---|---|---|
| KR | 1020210102526 A | 8/2021 |
| KR | 1020210149280 A | 12/2021 |
| KR | 1020220159550 A | 12/2022 |

* cited by examiner

1000

WIN
RCL
TL
ENC
CME
EL
PEL
CL
SUB

SPE1  SPE2  SPE3

SPE

PEL { SPE
      BP

D2

D3⊙→D1

F I G . 9
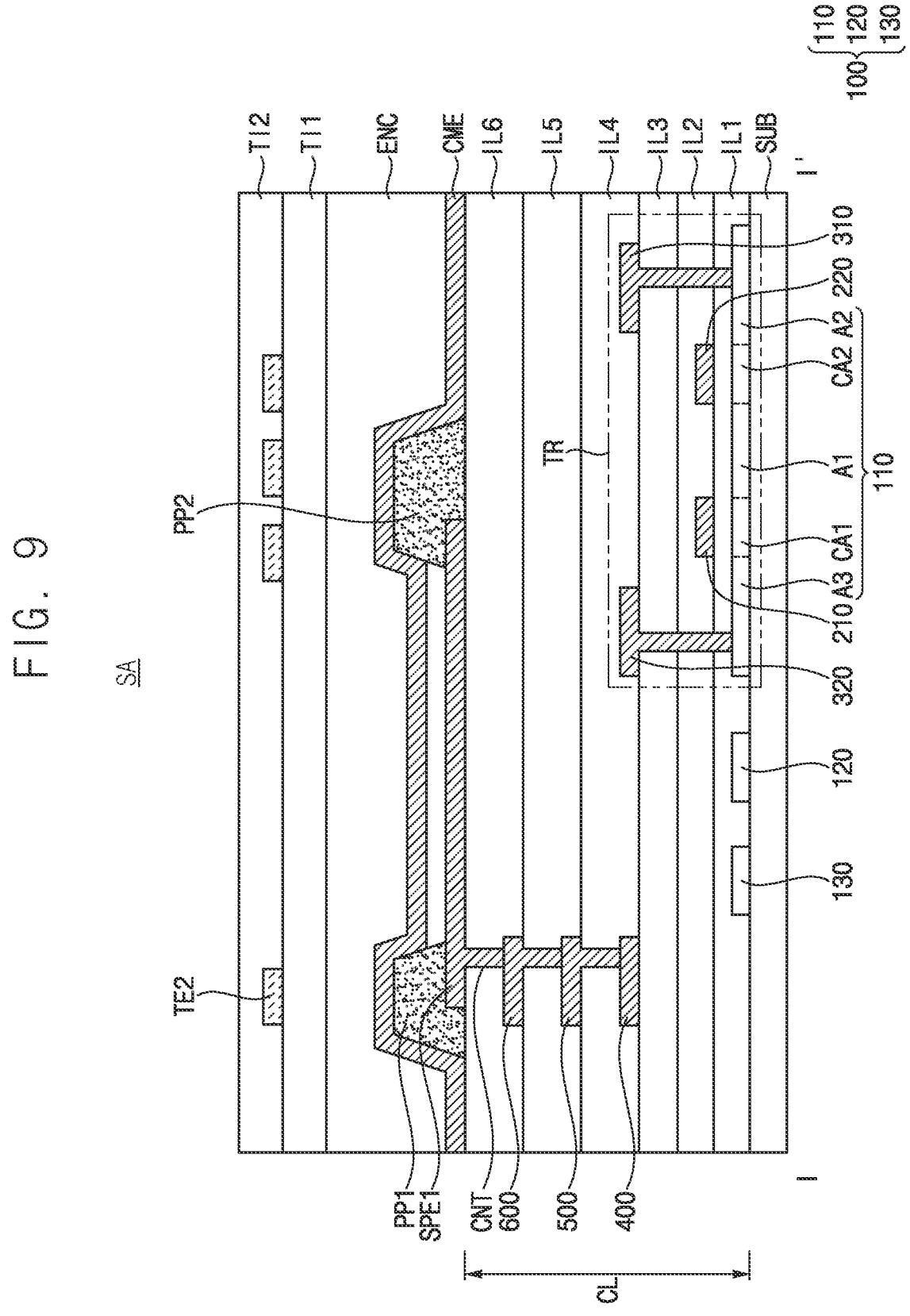

FIG. 11

|  | COMPARATIVE EXAMPLE | EXAMPLE | | |
|---|---|---|---|---|
| WIDTH OF EACH OF THE BLACK PATTERNS | — | 5um | | 7um |
| OPENING RATE OF THE CIRCUIT LAYER | 9.30% | 7.40% | | 5.80% |
| WAVELENGTH | 550nm | 940nm | 550nm | 940nm | 550nm | 940nm |
| TRANSMITTANCE OF SENSOR AREA | 1.72% | 2.77% | 1.38% | 2.70% | 1.08% | 1.72% |

DISPLAY APPARATUS WITH SENSOR-AREA BLACK PATTERNS ON THE CIRCUIT LAYER

This application claims priority to Korean Patent Application No. 10-2022-0095494, filed on Aug. 1, 2022, and all the benefits accruing therefrom under 35 U.S.C. § 119, the content of which in its entirety is herein incorporated by reference.

BACKGROUND

1. Field

Embodiments provide generally to display device.

2. Description of the Related Art

Recently, a display device is widely used in various fields. Such a display device typically includes a plurality of insulating layers, a plurality of active patterns, and a plurality of metal layers formed between the insulating layers.

SUMMARY

In a display device including a plurality of insulating layers, a plurality of active patterns, and a plurality of metal layers formed between the insulating layers, it may be desired to effectively block light from flowing into a transistor implemented with the active patterns and the metal layers to prevent degradation of characteristics of the transistor by the light.

Embodiments provide a display device.

A display device according to an embodiment of the invention includes a substrate including a display area and a sensor area surrounded by the display area, a circuit layer disposed on the substrate and including a plurality of pixel circuits, a plurality of display pixel electrodes disposed on the circuit layer and overlapping the display area, sensor a plurality of pixel electrodes disposed on the circuit layer and overlapping the sensor area, and a plurality of black patterns disposed on the circuit layer and overlapping the sensor pixel electrodes, respectively, where the black patterns cover boundary areas of the sensor pixel electrodes, respectively, and expose at least a portion of the circuit layer.

In an embodiment, the black patterns may be respectively disposed along the boundary areas of the sensor pixel electrodes.

In an embodiment, adjacent black patterns of the black patterns may be disconnected from each other.

In an embodiment, a width of each of the black patterns may be based on a predetermined transmittance of the sensor area.

In an embodiment, the width of each of the black patterns may be greater than or equal to about 5 micrometers ($\mu$m) and less than or equal to about 7 $\mu$m.

In an embodiment, an average of areas of the black patterns relative to an area of each of the pixel circuits may be greater than or equal to about 40% more and less than or equal to about 45%.

In an embodiment, the area of each of the pixel circuits may be greater than or equal to about 2050 square micrometers ($\mu$m$^2$) and less than or equal to about 3000 $\mu$m$^2$. In such an embodiment, the average of the areas of the black patterns may be greater than or equal to about 700 $\mu$m$^2$ and less than or equal to about 1000 $\mu$m$^2$.

In an embodiment, the sensor pixel electrodes may include a first sensor pixel electrode and a second sensor pixel electrode. In such an embodiment, the black patterns may include a first black pattern covering a boundary area of the first sensor pixel electrode and a second black pattern covering a boundary area of the second sensor pixel electrode. In such an embodiment, an area of the first sensor pixel electrode and an area of the second sensor pixel electrode may be different from each other. In such an embodiment, a width of the first black patterns and a width of the second black patterns may be equal to each other.

In an embodiment, an area of the first black pattern and an area of the second black pattern may be different from each other.

In an embodiment, the display device may further include a pixel defining layer covering boundaries of the display pixel electrodes. In such an embodiment, the pixel defining layer may further cover a portion of the circuit layer overlapping the display area and the black patterns may expose a portion of the circuit layer overlapping the sensor.

In an embodiment, the black patterns and the pixel defining layer may be disposed in a same layer as each other.

In an embodiment, the black patterns and the pixel defining layer may include a black component.

In an embodiment, a transmittance of the sensor area may be greater than a transmittance of the display area.

In an embodiment, the circuit layer may include an active pattern disposed on the substrate and including a first area, a second area, a first channel area, a second channel area, a third area, where the first area may be positioned between the first channel area and the second channel area, a first gate electrode disposed on the active pattern and overlapping the first channel area, a second gate electrode disposed in a same layer as the first gate electrode and overlapping the second channel area, a drain electrode disposed on the first and second gate electrodes and connected to the third area of the active pattern, a first connection pattern disposed in a same layer as the drain electrode, a second connection pattern disposed on the first connection pattern and connected to the first connection pattern, and a third connection pattern disposed on the second connection pattern and connected to the second connection pattern.

In an embodiment, each of the black patterns may include a first protrusion protruding in a first diagonal direction in a plan view and a second protrusion protruding in a second diagonal direction different from the first diagonal direction in the plan view.

In an embodiment, each of the sensor pixel electrodes may be connected to the third connection pattern through a contact hole. In such an embodiment, the first protrusion may overlap the contact hole and the second protrusion may overlap the first area of the active pattern.

In an embodiment, the display device may further include an encapsulation layer disposed on the display pixel electrodes and a touch layer disposed on the encapsulation layer and including a touch electrode. In such an embodiment, the touch electrode may continuously extend from the display area and the sensor area, and the touch electrode overlaps the first protrusion and the second protrusion.

In an embodiment, the first area of the active pattern, the second protrusion, and the touch electrode may overlap each other.

In an embodiment, the display device may further include an anti-reflection layer disposed on the touch layer.

In an embodiment, the display device may further include a functional module disposed in the sensor area.

A display device according to embodiments may include a circuit layer, display pixel electrodes, sensor pixel electrodes, a pixel defining layer, and black patterns. In such embodiments, the display pixel electrodes and the pixel defining layer may be formed in a display area, and the sensor pixel electrodes and the black patterns may be formed in a sensor area.

In such embodiments, as the pixel defining layer includes a black component, light may not be introduced into the circuit layer overlapping the display area. Accordingly, transistor characteristic of pixel circuits included in the circuit layer may not deteriorate.

In such embodiments, as the black patterns expose the sensor area of the circuit layer, transmittance of the sensor area may be greater than transmittance of the display area. Accordingly, a functional module disposed in the sensor area may operate more effectively.

BRIEF DESCRIPTION OF THE DRAWINGS

Illustrative, non-limiting embodiments will be more clearly understood from the following detailed description in conjunction with the accompanying drawings.

FIG. 7 is a cross-sectional view of the pixel electrode layer of FIG. 6.

FIG. 8 is a plan view illustrating an active layer, a pixel electrode layer, and a second touch electrode disposed in a sensor area of the display device of FIG. 1.

FIG. 9 is a cross-sectional view taken along line I-I' of FIG. 8.

FIG. 11 is a table showing transmittance of a display device according to a comparative example and a display device according to an embodiment of the invention.

DETAILED DESCRIPTION

Figure 1:
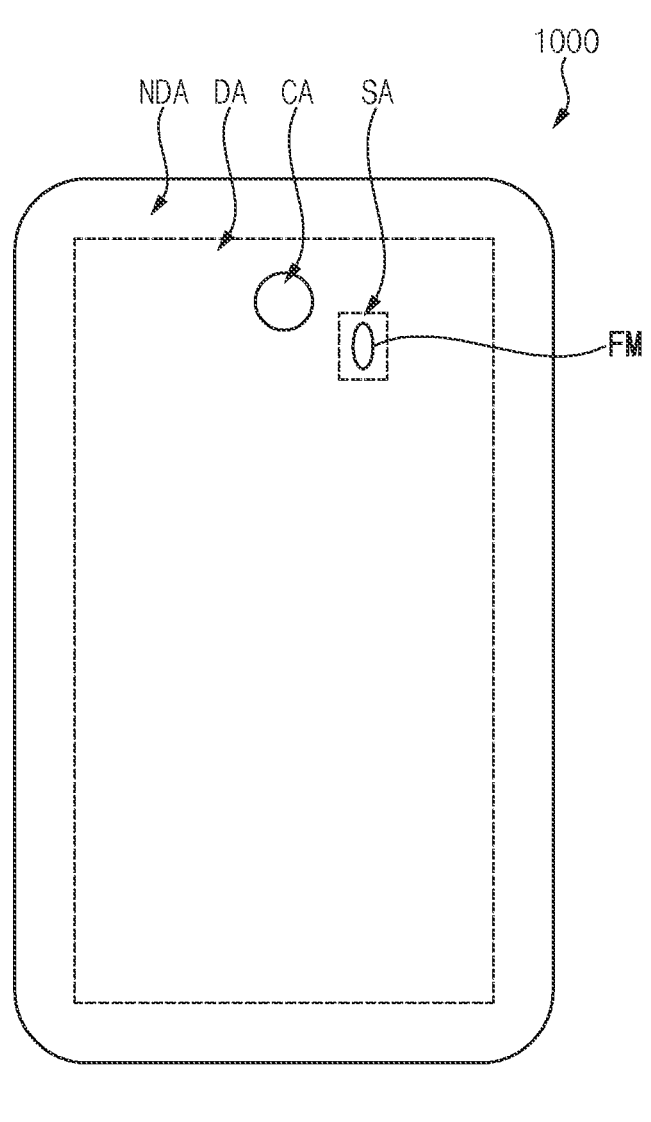
FIG. 1 is a plan view illustrating a display device according to an embodiment of the invention.
Figure 1:
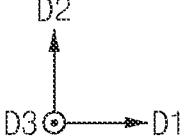

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display device according to embodiments of the disclosure will be described in detail with reference to the accompanying drawings. The same reference numerals are used for the same components in the drawings, and any repetitive detailed descriptions of the same components will be omitted or simplified.

FIG. 1 is a plan view illustrating a display device according to an embodiment of the invention.

Referring to FIG. 1, a display device 1000 according to an embodiment may include a display area DA, a sensor area SA, a camera area CA, and a non-display area NDA.

A pixel may be disposed in the display area DA, and an image may be displayed in the display area DA. In an embodiment, the display area DA may be defined to surround the sensor area SA and the camera area CA.

A functional module FM may be disposed in the sensor area SA. In an embodiment, for example, the functional module FM may include an acceleration sensor module and a geomagnetic sensor module for determining the movement of the display device 1000, a proximity sensor module and an infrared sensor module for detecting proximity of the display device 1000, an illuminance sensor module for measuring the degree of external brightness, or the like.

In an embodiment, transmittance of the sensor area SA may be greater than transmittance of the display area DA. Accordingly, the functional module FM may operate more effectively. In an embodiment, the sensor area SA may display an image.

A camera module for photographing (or recognizing) an image of an object may be disposed in the camera area CA. In an embodiment, transmittance of the camera area CA may be greater than transmittance of the display area DA. Accordingly, the camera module may operate more effectively. In an embodiment, the camera area CA may display an image.

Figure 2:
FIG. 2 is a cross-sectional view illustrating the display device of FIG. 1.

FIG. 2 is a cross-sectional view illustrating the display device of FIG. 1.

Referring to FIG. 2, an embodiment of the display device 1000 may include a substrate SUB, a circuit layer CL, a pixel electrode layer PEL, a light emitting layer EL, a common electrode CME, an encapsulation layer ENC, a touch layer TL, an antireflection layer RPL, and a window WIN.

The substrate SUB may include a transparent or opaque material. In an embodiment, a material of the substrate SUB, i.e., materials that can be used as the substrate SUB, may include glass, quartz, plastic, or the like. These may be used alone or in combination with each other.

The circuit layer CL may be disposed on the substrate SUB. The circuit layer CL may include a plurality of insulating layers, a plurality of active patterns, a plurality of electrodes, and a plurality of lines. The electrodes and the lines may be disposed between the insulating layers. The active patterns, the electrodes, and the lines may configure pixel circuits. Each of the pixel circuits may generate a driving current.

The pixel electrode layer PEL may be disposed on the circuit layer CL. The pixel electrode layer PEL may be electrically connected to the circuit layer CL and receive the driving current from the circuit layer CL.

The light emitting layer EL may be disposed on the pixel electrode layer PEL. In an embodiment, the light emitting layer EL may include a self-emitting organic material and generate light corresponding to the driving current.

The common electrode CME may be disposed on the light emitting layer EL. A common voltage may be provided to the common electrode CME, and the common voltage may be a reference voltage for the light emitting layer EL to generate light.

The encapsulation layer ENC may be disposed on the common electrode CME. The encapsulation layer ENC may prevent a defect due to penetration of moisture and/or oxygen into the light emitting layer EL. In an embodiment, for example, the encapsulation layer ENC may include a first inorganic layer, an organic layer disposed on the first inorganic layer, and a second inorganic layer disposed on the organic layer.

The touch layer TL may be disposed on the encapsulation layer ENC. The touch layer TL may sense a user's touch. In an embodiment, for example, the touch layer TL may include a first touch electrode, a touch insulating layer disposed on the first touch electrode, and a second touch electrode disposed on the touch insulating layer. In an embodiment, the first touch electrode may be directly formed on the second inorganic layer.

In an embodiment, the anti-reflection layer RCL may be disposed on the touch layer TL. In an embodiment, the anti-reflection layer RCL may include a polarizer and polarize external light. Accordingly, reflection of external light of the display device 1000 may be reduced.

In an alternative embodiment, the display device 1000 may include a color filter layer. The color filter layer may include color filters and transmit only light having a predetermined wavelength range. In such an embodiment, the display device 1000 may not include the anti-reflection layer RCL.

The window WIN may be disposed on the anti-reflection layer RCL. The window WIN may have a predetermined strength, and components under the window WIN may be protected.

Figure 3:
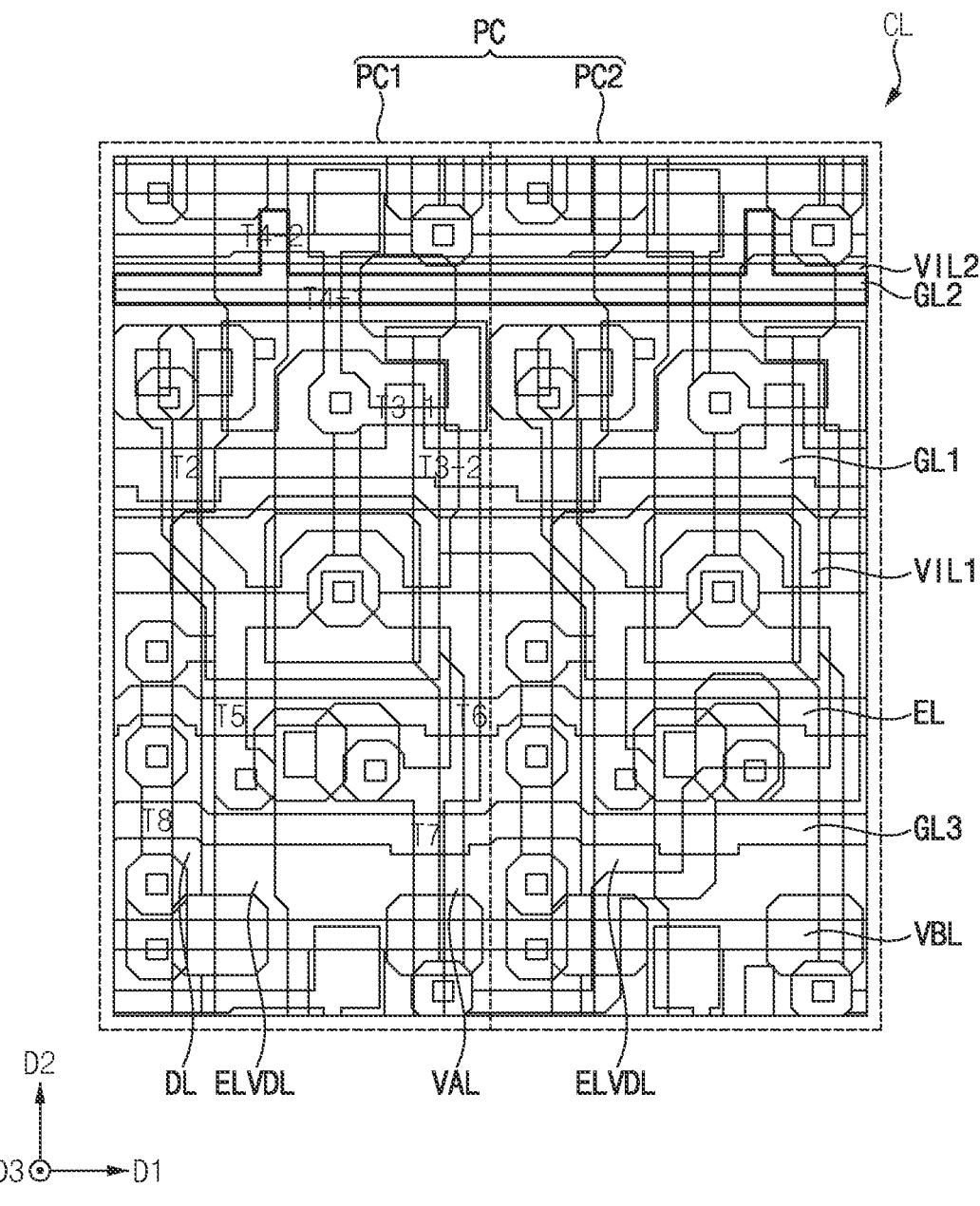
FIG. 3 is a plan view of a circuit layer included in the display device of FIG. 2.
Figure 4:
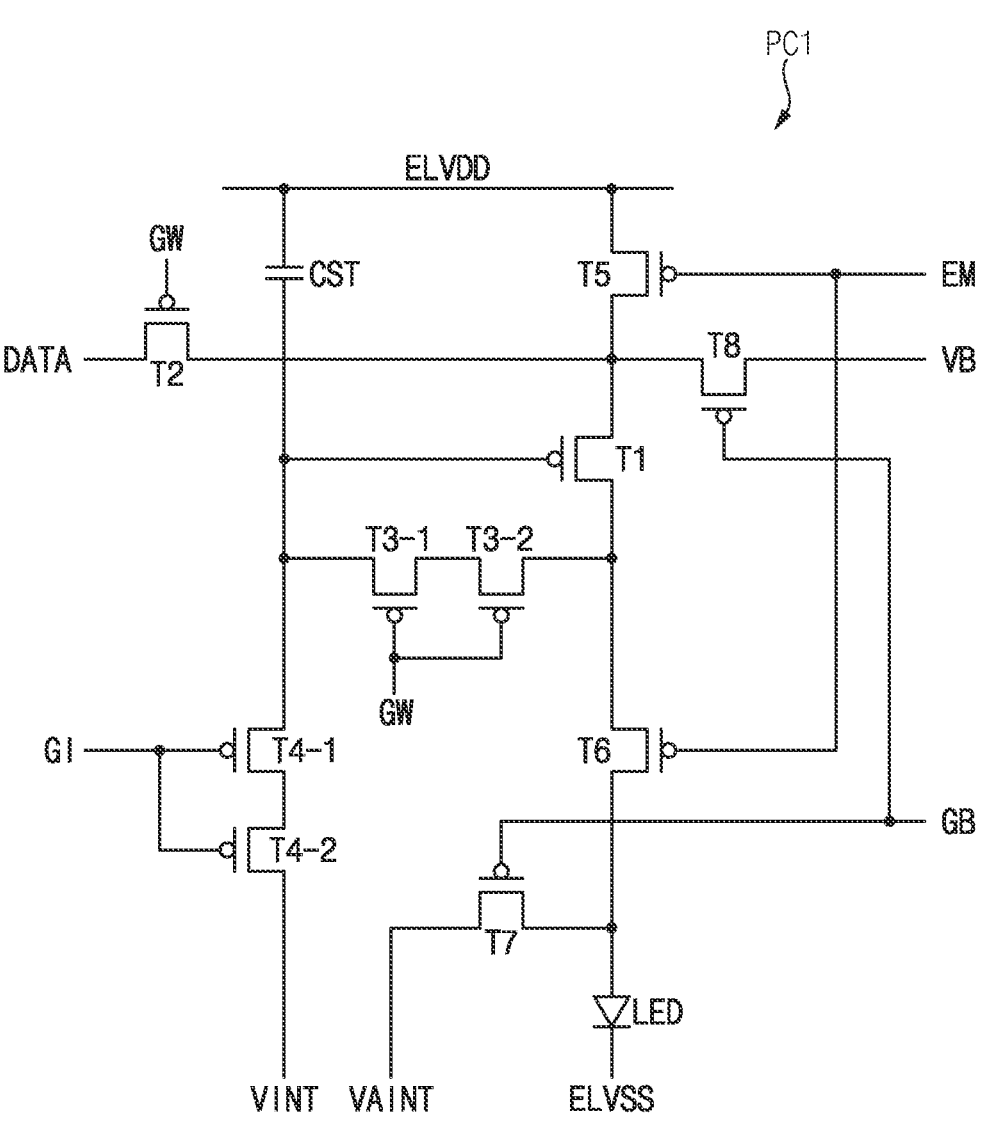
FIG. 4 is a circuit diagram of a pixel circuit included in the circuit layer of FIG. 3.

FIG. 3 is a plan view of a circuit layer included in the display device of FIG. 2. FIG. 4 is a circuit diagram of a pixel circuit included in the circuit layer of FIG. 3.

Referring to FIGS. 3 and 4, in an embodiment, the circuit layer CL may include a plurality of pixel circuits PC. Each of the pixel circuits PC may generate a driving current and provide the driving current to the pixel electrode layer PEL.

In an embodiment, the pixel circuits PC may include a first pixel circuit PC1 and a second pixel circuit PC2. The first pixel circuit PC1 and the second pixel circuit PC2 may be arranged in a matrix form.

In an embodiment, the area of the first pixel circuit PC1 may be greater than or equal to about 2050 square micrometers ($\mu m^2$) and less than or equal to about 3000 $\mu m^2$. In an embodiment, for example, the length of the first pixel circuit PC1 in a first direction D1 may be about 32.3 micrometers ($\mu m$), and the length in a second direction D2 crossing the first direction D1 may be about 64.6 $\mu m$. In such an embodiment, the area of the first pixel circuit PC1 may be approximately 2086.6 $\mu m^2$. Here, a third direction D3 may be a direction perpendicular to the first direction D1 and the second direction D2, or may be a thickness direction of the display device 1000 or the substrate SUB thereof.

The second pixel circuit PC2 may have substantially a same shape and a same area as the first pixel circuit PC1.

In an embodiment, the first pixel circuit PC1 may include a first transistor T1, a second transistor T2, a first third transistor T3-1, a second third transistor T3-2, a first fourth transistor T4-1, a second fourth transistor T4-2, a fifth transistor T5, a sixth transistor T6, a seventh transistor T7, a eighth transistor T8, a capacitor CST, a first gate signal line GL1, a second gate signal line GL2, a third gate signal line GL3, a data voltage line DL, a high power supply voltage line ELVDL, a low power supply voltage line, a first initialization voltage line VIL1, a second initialization voltage line VIL2, an anode initialization voltage line VAL, an emission control signal line EL, and a bias voltage line VBL. The first pixel circuit PC1 may provide the driving current to the light emitting diode LED.

The first transistor T1 may include a gate terminal, a first terminal, and a second terminal. The gate terminal of the first transistor T1 may be connected to the capacitor CST. The first terminal of the first transistor T1 may be connected to the fifth transistor T5. The second terminal of the first transistor T1 may be connected to the sixth transistor T6. The first transistor T1 may generate a driving current based on a high power supply voltage ELVDD and a data voltage DATA.

The second transistor T2 may include a gate terminal, a first terminal, and a second terminal. The gate terminal of the second transistor T2 may be connected to the first gate signal line GL1 that provides a first gate signal GW. The first terminal of the second transistor T2 may be connected to the data signal line DL that provides the data voltage DATA. The second terminal of the second transistor T2 may be connected to the first transistor T1. The second transistor T2 may transmit the data voltage DATA in response to the first gate signal GW.

The first third transistor T3-1 and the second third transistor T3-2 may be connected in series between the second terminal of the first transistor T1 and the gate terminal of the first transistor T1. Gate terminals of the first third transistor T3-1 and the second third transistor T3-2 may be connected to the first gate signal line GL1 that provides the first gate signal GW. The first third transistor T3-1 and the second third transistor T3-2 may compensate a threshold voltage of the first transistor T1 in response to the first gate signal GW.

The first fourth transistor T4-1 and the second fourth transistor T4-2 may be connected in series between the initialization voltage lines VIL1 and VIL2 that provides an initialization voltage VINT and the gate terminal of the first transistor T1. Gate terminals of the first fourth transistor T4-1 and the second fourth transistor T4-2 may be connected to the second gate signal line GI that provides a second gate signal GI. The first fourth transistor T4-1 and the second fourth transistor T4-2 may initialize the gate terminal of the first transistor T1 in response to the second gate signal GI.

The fifth transistor T5 may include a gate terminal, a first terminal, and a second terminal. The gate terminal of the fifth transistor T5 may be connected to the light emitting control signal line EL that provides a light emitting control signal EM. The first terminal of the fifth transistor T5 may be connected to the high power voltage line ELVDL that provides a high power voltage ELVDD. The second terminal of the fifth transistor T5 may be connected to the first transistor T1. The fifth transistor T5 may transmit the high power supply voltage ELVDD in response to the emission control signal EM.

The sixth transistor T6 may include a gate terminal, a first terminal, and a second terminal. The gate terminal of the sixth transistor T6 may be connected to the light emitting control signal line EL that provides the light emitting control signal EM. The first terminal of the sixth transistor T6 may be connected to the first transistor T1. The second terminal of the sixth transistor T6 may be connected to the light emitting diode LED. The sixth transistor T6 may transmit the driving current to the light emitting diode LED in response to the emission control signal EM.

The seventh transistor T7 may include a gate terminal, a first terminal, and a second terminal. The gate terminal of the seventh transistor T7 may be connected to the third gate signal line GL3 that provides a third gate signal GB. The first terminal of the seventh transistor T7 may be connected to the anode initialization voltage line VAL that provides an anode initialization voltage VAINT. The second terminal of the seventh transistor T7 may be connected to the light emitting diode LED. The seventh transistor T7 may initialize the light emitting diode LED in response to the third gate signal GB.

The eighth transistor T8 may include a gate terminal, a first terminal, and a second terminal. The gate terminal of the eighth transistor T8 may be connected to the third gate signal transfer line GL3 that provides the third gate signal GB. The first terminal of the eighth transistor T8 may be connected to the bias voltage line VBL that provides a bias voltage VB. The second terminal of the eighth transistor T8 may be connected to the first transistor T1. The eighth transistor T8 may transmit the bias voltage VB in response to the third gate signal GB.

The capacitor CST may include a first terminal and a second terminal. The first terminal of the capacitor CST may be connected to the high power voltage line ELVDL that provides the high power voltage ELVDD. The second terminal of the capacitor CST may be connected to the gate terminal of the first transistor T1.

The light emitting diode LED may include a first terminal and a second terminal. The first terminal of the light emitting diode LED may be connected to the sixth transistor T6. The second terminal of the light emitting diode LED may be connected to the low power voltage line that provides a low power voltage ELVSS. The light emitting diode LED may generate light corresponding to the driving current.

Here, each of the first gate signal line GL1, the second gate signal line GL2, the third gate signal line GL3, the second initialization voltage line VIL2, and the emission control signal line EL, and the bias voltage line VBL may extend in the first direction D1. Each of the data voltage line DL, the high power supply voltage line ELVDL, the low power supply voltage line, the first initialization voltage line VIL1, and the anode initialization voltage line VAL may extend in the second direction D2 crossing the first direction D1.

Figure 5:
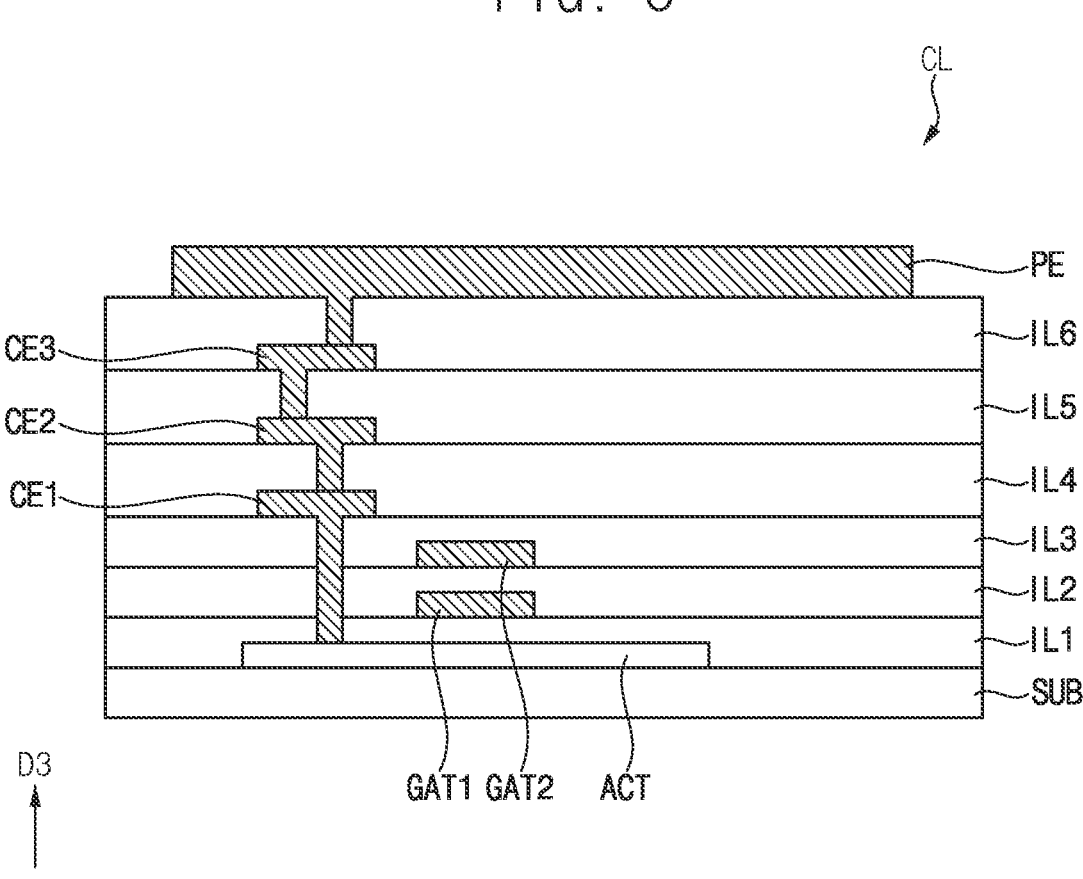
FIG. 5 is a cross-sectional view of the circuit layer of FIG. 3.

FIG. 5 is a cross-sectional view of the circuit layer of FIG. 3.

Referring to FIG. 5, in an embodiment, the circuit layer CL may include an active pattern ACT, a first insulating layer IL1, a first gate electrode GAT1, a second insulating layer IL2, a second gate electrode GAT2, a third insulating layer IL3, a first connection electrode CE1, a fourth insulating layer IL4, a second connection electrode CE2, a fifth Insulation layer IL5, a third connection electrode CE3, and a sixth insulating layer IL6.

The active pattern ACT may be disposed on the substrate SUB. In an embodiment, the active pattern ACT may include or be formed of a silicon semiconductor material or an oxide semiconductor material. In an embodiment where the active pattern ACT includes the silicon semiconductor material, the silicon semiconductor material may include amorphous silicon, polycrystalline silicon, or the like. In an embodiment where the active pattern ACT includes the oxide semiconductor material, the oxide semiconductor material may include InGaZnO ("IGZO") or InSnZnO ("ITZO"). In such an embodiment, the oxide semiconductor material may further include at least one selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). These may be used alone or in combination with each other.

The first insulating layer IL1 may be disposed on the substrate SUB and may cover the active pattern ACT. In an embodiment, the first insulating layer IL1 may include or be formed of an insulating material. In such an embodiment, the insulating material of the first insulating layer IL1 may include silicon oxide, silicon nitride, silicon oxynitride, or the like. These may be used alone or in combination with each other. In such an embodiment, the first insulating layer IL1 may be configured as a single layer or a multi-layer structure, that is, may have a single layer structure or a multi-layer structure.

The first gate electrode GAT1 may be disposed on the first insulating layer IL1. In an embodiment, the first gate electrode GAT1 may include or be formed of metal, alloy, conductive metal oxide, transparent conductive material, or the like. Examples of materials that can be used as the first gate electrode GAT1 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), or the like. These may be used alone or in combination with each other. In such an embodiment, the first gate electrode GAT1 may be configured as a single layer or a multi-layer structure.

The second insulating layer IL2 may be disposed on the first insulating layer IL1 and may cover the first gate electrode GAT1. In an embodiment, the second insulating layer IL2 may include or be formed of an insulating material.

The second gate electrode GAT2 may be disposed on the second insulating layer IL2 and may overlap the first gate electrode GAT1. In an embodiment, the second gate electrode GAT2 may include or be formed of metal, alloy, conductive metal oxide, transparent conductive material, or the like.

The third insulating layer IL3 may be disposed on the second insulating layer IL2 and may cover the second gate electrode GAT2. In an embodiment, the third insulating layer IL3 may include or be formed of an insulating material.

The first connection electrode CE1 may be disposed on the third insulating layer IL3 and may be connected to the active pattern ACT. In an embodiment, the first connection electrode CE1 may include or be formed of a metal, an alloy, a conductive metal oxide, a transparent conductive material, or the like.

The fourth insulating layer IL4 may be disposed on the third insulating layer IL3 and may cover the first connection electrode CE1. In an embodiment, the fourth insulating layer IL4 may include or be formed of an insulating material.

The second connection electrode CE2 may be disposed on the fourth insulating layer IL4 and may be connected to the first connection electrode CE1. In an embodiment, the second connection electrode CE2 may include or be formed of a metal, an alloy, a conductive metal oxide, a transparent conductive material, or the like.

The fifth insulating layer IL5 may be disposed on the fourth insulating layer IL4 and may cover the second connection electrode CE2. In an embodiment, the fifth insulating layer IL5 may include or be formed of an insulating material.

The third connection electrode CE3 may be disposed on the fifth insulating layer IL5 and may be connected to the second connection electrode CE2 and the pixel electrode PE. In an embodiment, the third connection electrode CE3 may include or be formed of a metal, an alloy, a conductive metal oxide, a transparent conductive material, or the like.

The sixth insulating layer IL6 may be disposed on the fifth insulating layer IL5 and may cover the third connection electrode CE3. In an embodiment, the sixth insulating layer IL6 may include or be formed of an insulating material.

Figure 6:
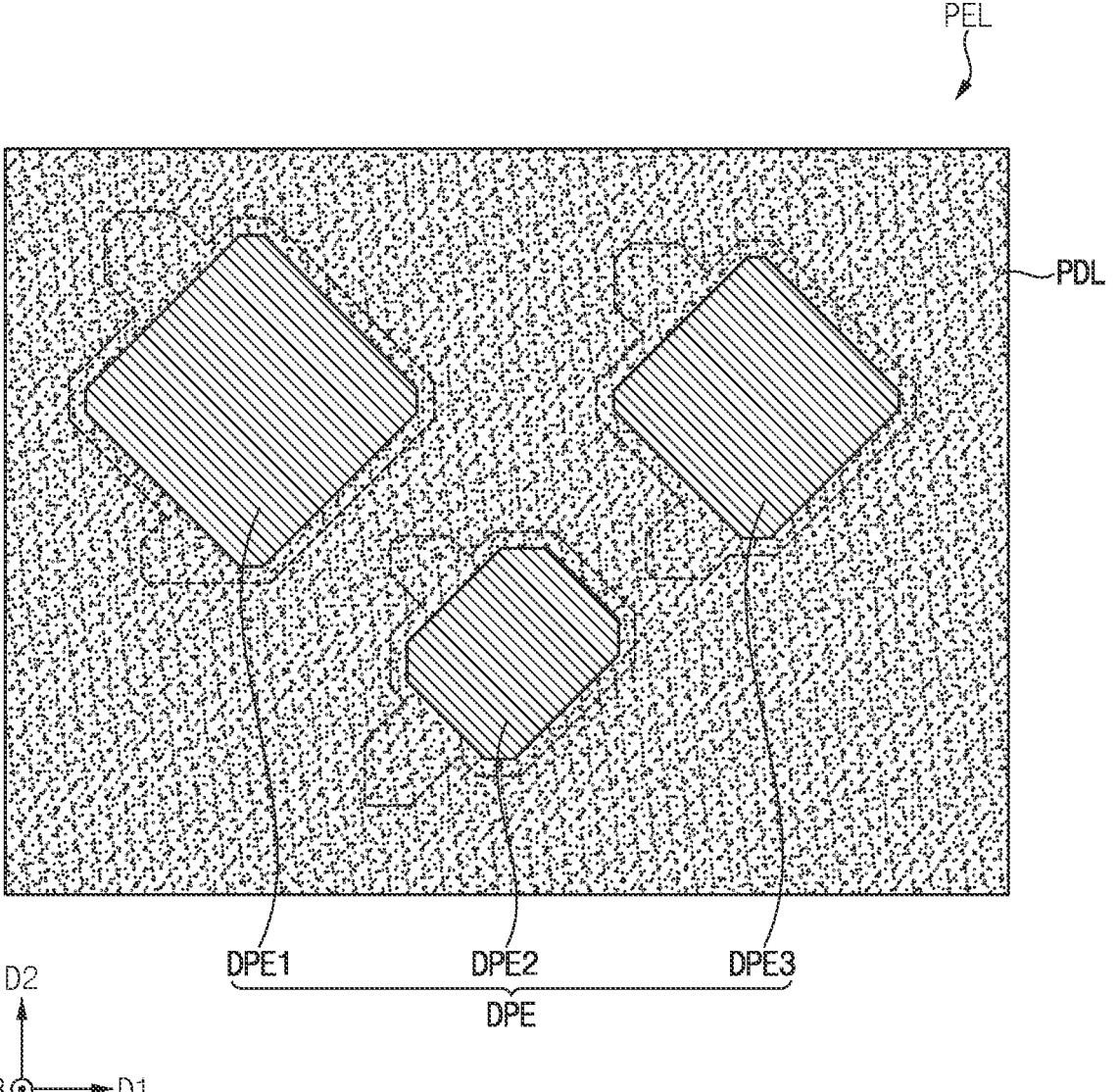
FIG. 6 is a plan view of a pixel electrode layer disposed in a display area of the display device of FIG. 1.
Figure 7:
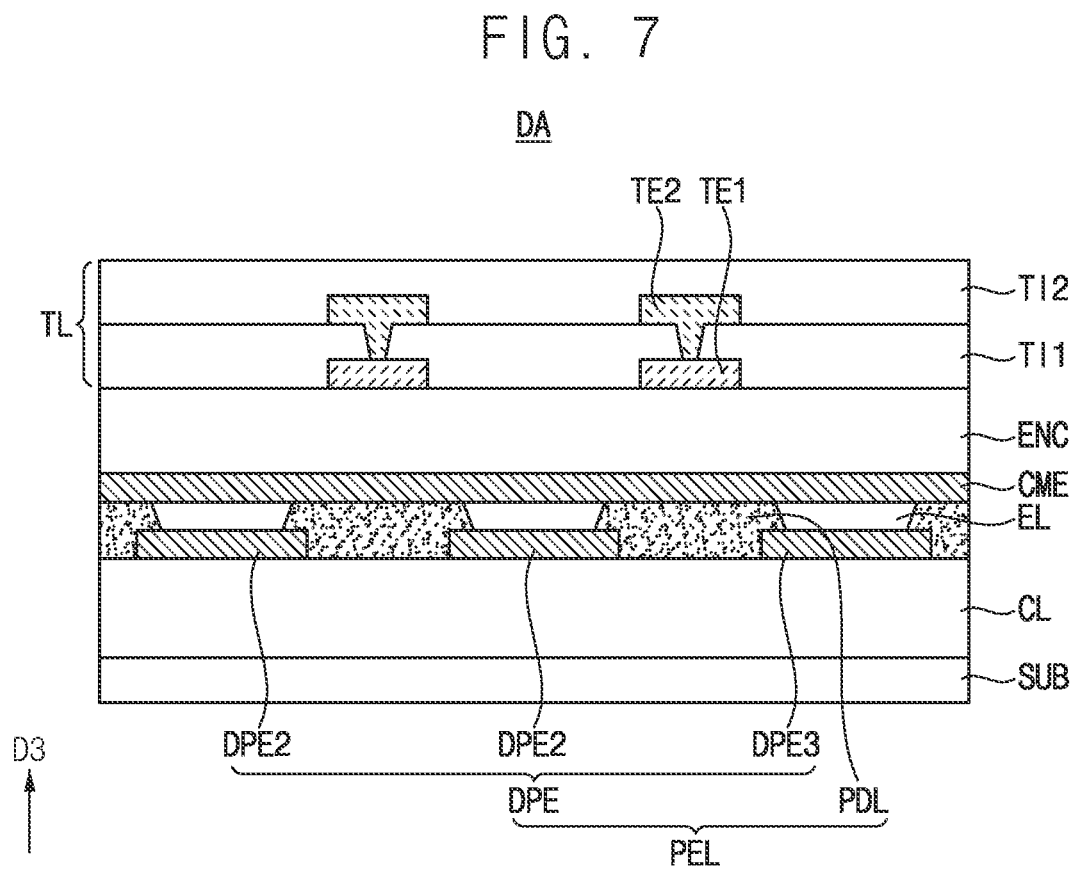
Figure 8:
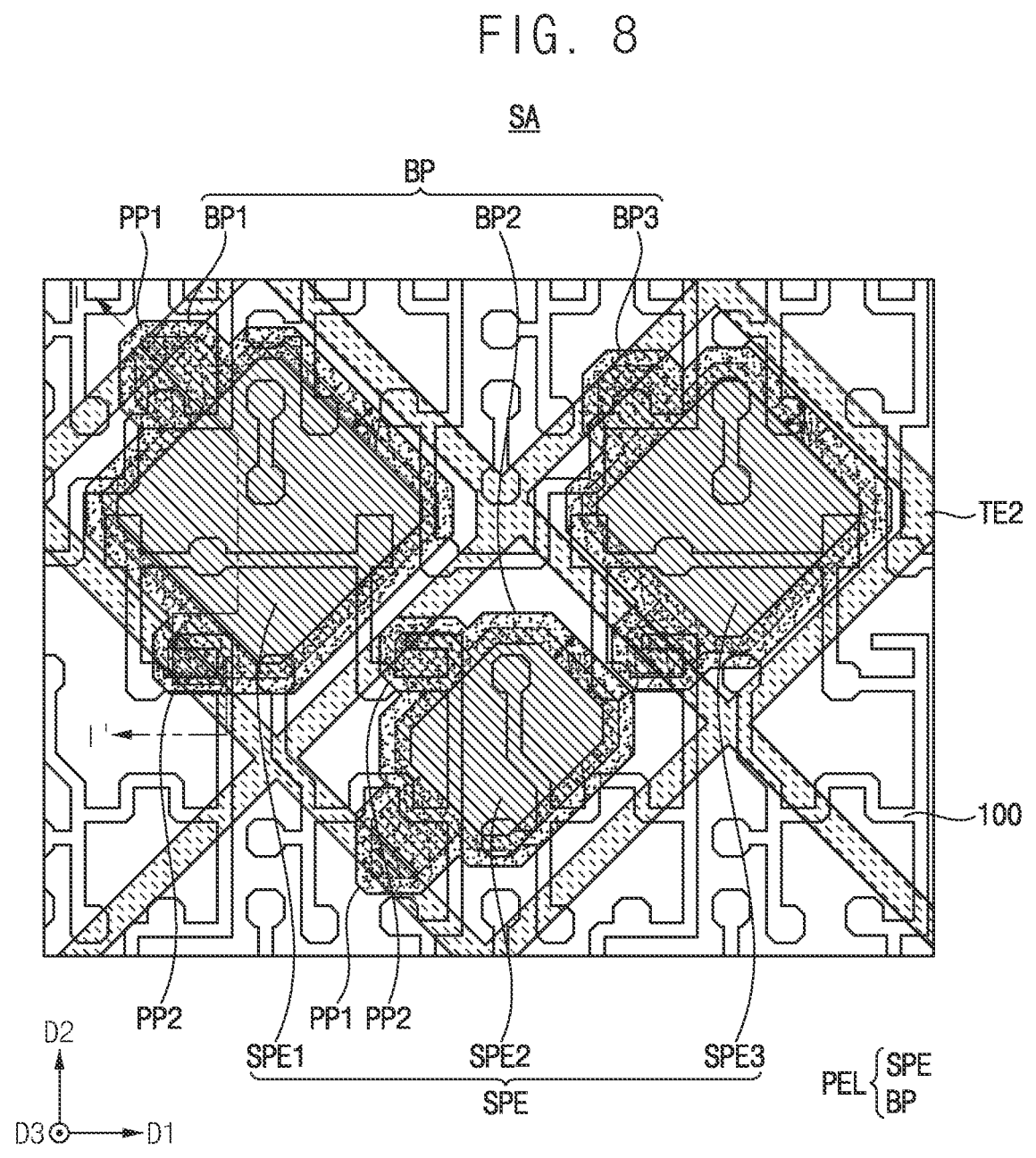
Figure 10:
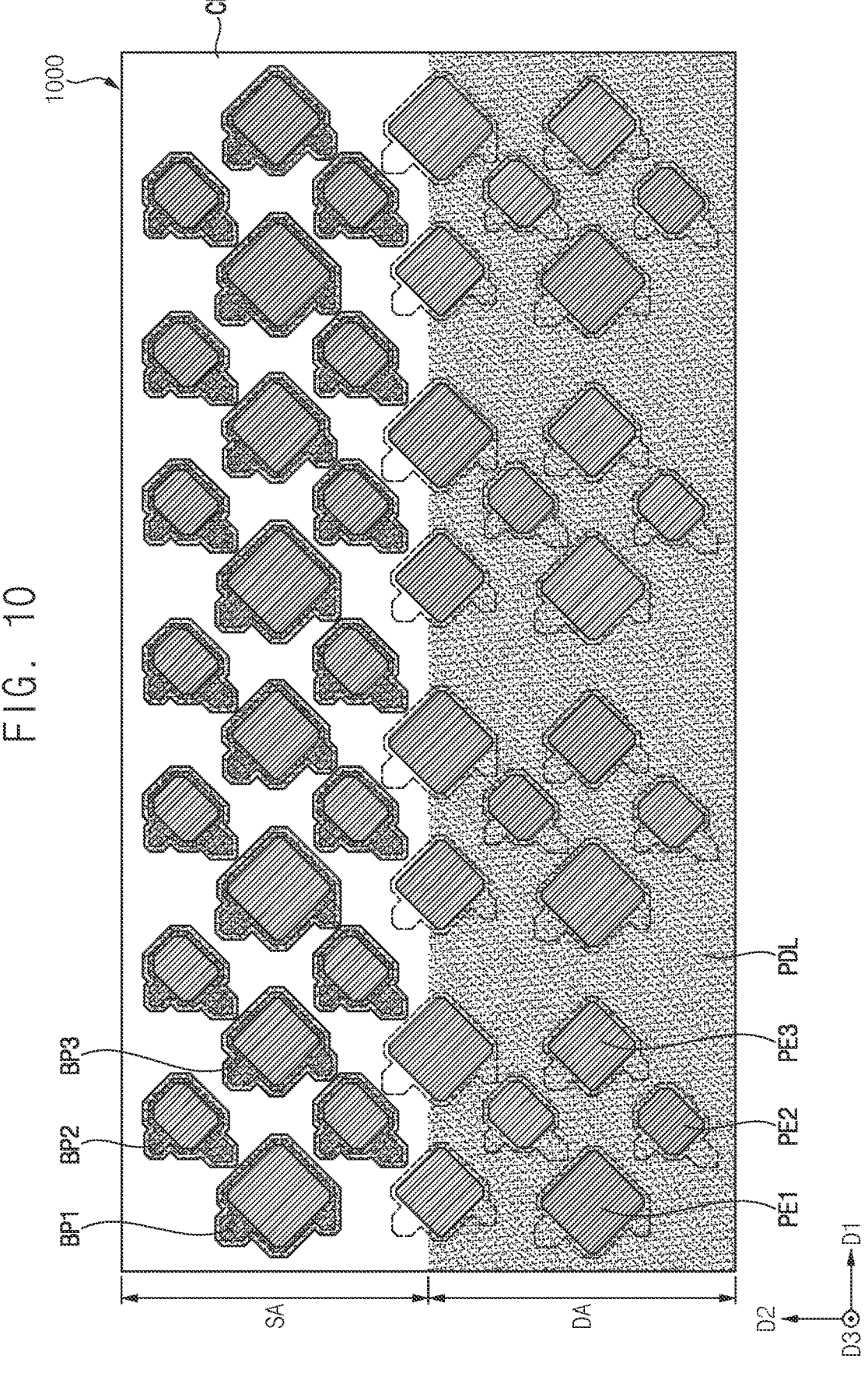
FIG. 10 is a plan view of a pixel electrode layer disposed at a boundary between a display area and a sensor area of the display device of FIG. 1.

FIG. 6 is a plan view of a pixel electrode layer disposed in a display area of the display device of FIG. 1. FIG. 7 is a cross-sectional view of the pixel electrode layer of FIG. 6. FIG. 8 is a plan view illustrating an active layer, a pixel electrode layer, and a second touch electrode disposed in a sensor area of the display device of FIG. 1. FIG. 9 is a cross-sectional view taken along line I-I' of FIG. 8. FIG. 10 is a plan view of a pixel electrode layer disposed at a boundary between a display area and a sensor area of the display device of FIG. 1.

Referring to FIGS. 6 and 7, in an embodiment, the pixel electrode layer PEL may include a plurality of display pixel electrodes DPE and a pixel defining layer PDL.

In an embodiment, the display pixel electrodes DPE may include a first display pixel electrode DPE1, a second display pixel electrode DPE2, and a third display pixel electrode DPE3.

The first display pixel electrode DPE1, the second display pixel electrode DPE2, and the third display pixel electrode DPE3 may be disposed on the circuit layer CL, and overlap the display area DA. In an embodiment, the first display pixel electrode DPE1, the second display pixel electrode DPE2, and the third display pixel electrode DPE3 may include or be formed of metal, alloy, conductive metal oxide, transparent conductive material, or the like.

In an embodiment, areas of the first display pixel electrode DPE1, the second display pixel electrode DPE2, and the third display pixel electrode DPE3 may be different from each other. In an embodiment, for example, the area of the first display pixel electrode DPE1 may greater than the area of the second display pixel electrode DPE2, the area of the third display pixel electrode DPE3 may greater than the area of the third display pixel electrode DPE3, and the area of the third display pixel electrode DPE3 may be greater than the area of the second display pixel electrode DPE2.

The pixel definition layer PDL may be disposed on the circuit layer CL, the first display pixel electrode DPE1, the second display pixel electrode DPE2, and the third display pixel electrode DPE3. In an embodiment, the pixel defining layer PDL may include or be formed of an organic insulating material. In an embodiment, the pixel defining layer PDL may include a black component. In such an embodiment, for example, the black component may be a black dye, a black pigment, or the like, and may include a metal (carbon black, chromium, or the like) or a metal oxide.

In an embodiment, the pixel defining layer PDL may cover a boundary (or a boundary area) of the first display pixel electrode DPE1, a boundary of the second display pixel electrode DPE2, and a boundary of the third display pixel electrode DPE3. In such an embodiment, the pixel defining layer PDL may further cover the display area DA of the circuit layer CL. Accordingly, a central portion of the first display pixel electrode DPE1, a central portion of the second display pixel electrode DPE2, and a central portion of the third display pixel electrode DPE3 may be exposed by the pixel defining layer PDL.

In an embodiment, as described above, the common electrode CME may be disposed on the pixel defining layer PDL, and the encapsulation layer ENC may be disposed on the common electrode CME. In an embodiment, the touch layer TL may be disposed on the encapsulation layer ENC.

The touch layer TL may include a first touch insulating layer TI1, a first touch electrode TE1, a second touch electrode TE2, and a second touch insulating layer TI2.

The first touch electrode TE1 may be disposed on the encapsulation layer ENC. In an embodiment, for example, the first touch electrode TE1 may include or be formed of a metal, an alloy, a conductive metal oxide, a transparent conductive material, or the like. These may be used alone or in combination with each other.

The first touch insulating layer TI1 may be disposed on the encapsulation layer ENC and may continuously extend from the display area DA to the sensor area SA. The first touch insulating layer TI1 may cover the first touch electrode TE1. In an embodiment, for example, the first touch insulating layer TI1 may include silicon oxide, silicon nitride, or the like. These may be used alone or in combination with each other.

The second touch electrode TE2 may be disposed on the first touch insulating layer TI1. The second touch electrode TE2 may be connected to the first touch electrode TE1. The second touch electrode TE2 may continuously extend from the display area DA to the sensor area SA. In an embodiment, for example, the second touch electrode TE2 may include or be formed of a metal, an alloy, a conductive metal oxide, a transparent conductive material, or the like. These may be used alone or in combination with each other.

The second touch insulating layer TI2 may be disposed on the first touch insulating layer TI1 and may continuously extend from the display area DA to the sensor area SA. The second touch insulating layer TI2 may cover the second touch electrode TE2. In an embodiment, for example, the second touch insulating layer TI2 may include silicon oxide, silicon nitride, or the like. These may be used alone or in combination with each other.

Referring to FIGS. 8 and 9, the pixel electrode layer PEL may be disposed on the circuit layer CL, and the pixel electrode layer PEL may further include a plurality of sensor pixel electrodes SPE and a plurality of black patterns BP. Here, the sensor pixel electrodes SPE refer to pixel electrodes in the sensor area SA.

Particularly, FIG. 9 is a cross-sectional view illustrating the circuit layer CL and the pixel electrode layer PEL including the active layer 100 of FIG. 8. Although FIG. 9 illustrates only a first cross-sectional structure of the circuit layer CL and the pixel electrode layer PEL including the first sensor pixel electrode SPE1 and the first black pattern BP1 for convenience of illustration, a second cross-sectional structure of the circuit layer CL and the pixel electrode layer PEL including second and third sensor pixel electrodes SPE1 and SPE2 and second and third black patterns BP2 and BP3 may be substantially the same as the first cross-sectional structure.

First, components of the circuit layer CL in the sensor area SA will be described. Hereinafter, any repetitive detailed descriptions of the same or like elements as those of the circuit layer CL described with reference to FIG. 2 will be omitted or simplified.

The circuit layer CL may include the substrate SUB, an active layer 100, a first gate electrode 210, a second gate electrode 220, a source electrode 310, a drain electrode 320, the first to six insulating layers IL1, IL2, IL3, IL4, IL5, and IL6, a first connection pattern (or a first conductive pattern) 400, a second connection pattern (or a second conductive pattern) 500, and a third connection pattern (or a third conductive pattern) 600.

The active layer 100 may be disposed on the substrate SUB. The active layer 100 may include or be formed of a silicon semiconductor material or an oxide semiconductor material. The active layer 100 may include a first active pattern 110, a second active pattern 120 and a third active pattern 130. The first, second, and third active patterns 110, 120, and 130 may include a same material as each other and may be disposed in (or directly) on a same layer as each other.

The first active pattern 110 may include a first area A1, a second area A2, a third area A3, a first channel area CA1, and a second channel area CA2. In an embodiment, for example, the first area A1 may be positioned between the first channel area CA1 and the second channel area CA2.

The first gate electrode 210 and the second gate electrode 220 may be disposed on the first insulating layer IL1. The first gate electrode 210 may overlap the first channel area CA1, and the second gate electrode 220 may overlap the second channel area CA2. In an embodiment, for example, each of the first gate electrode 210 and the second gate electrode 220 may include or be formed of a metal, an alloy, a conductive metal oxide, a transparent conductive material, or the like. These may be used alone or in combination with each other. The first gate electrode 210 and the second gate electrode 220 may include a same material as each other and may be disposed in (or directly on) a same layer as each other.

The source electrode 310 and the drain electrode 320 may be disposed on the third insulating layer IL3. The source electrode 310 may be connected to the second area A2 of the first active pattern 110, and the drain electrode 320 may be connected to the third area A3 of the first active pattern 110. In an embodiment, for example, each of the source electrode 310 and the drain electrode 320 may include or be formed of a metal, an alloy, a conductive metal oxide, a transparent conductive material, or the like. These may be used alone or in combination with each other.

Accordingly, the transistor TR including the first active pattern 110, the first gate electrode 210, the second gate electrode 220, the source electrode 310, and the drain electrode 320 may be disposed on the substrate SUB in the sensor area SA. In an embodiment, the transistor TR may correspond to the first third and second third transistors T3-1 and T3-2 illustrated in FIGS. 2 and 3.

The first connection pattern 400 may be disposed on the third insulating layer IL3. The first connection pattern 400 may be disposed in (or directly on) a same layer as the source electrode 310 and the drain electrode 320. The first connection pattern 400 may be connected to a portion of the active layer 100. In an embodiment, for example, the first connection pattern 400 may include or be formed of metal, alloy, conductive metal oxide, transparent conductive material, or the like. These may be used alone or in combination with each other.

The second connection pattern 500 may be disposed on the fourth insulating layer IL4. The second connection pattern 500 may be connected to the first connection pattern 400. In an embodiment, for example, the second connection pattern 400 may include or be formed of metal, alloy, conductive metal oxide, transparent conductive material, or the like. These may be used alone or in combination with each other.

The third connection pattern 600 may be disposed on the fifth insulating layer IL5. The third connection pattern 600 may be connected to the second connection pattern 500. In an embodiment, for example, the third connection pattern 600 may include or be formed of metal, alloy, conductive metal oxide, transparent conductive material, or the like. These may be used alone or in combination with each other.

Next, components of the pixel electrode layer PEL in the sensor area SA will be described.

In an embodiment, the sensor pixel electrodes SPE may include the first sensor pixel electrode SPE1, the second sensor pixel electrode SPE2, and the third sensor pixel electrode SPE3.

The first sensor pixel electrode SPE1, the second sensor pixel electrode SPE2, and the third sensor pixel electrode SPE3 may be disposed on the circuit layer CL, and overlap the sensor area SA. In an embodiment, the sensor pixel electrodes SPE may be formed together with the display pixel electrodes DPE and may include a same material as each other (e.g., formed through or during a same process using a same material).

In an embodiment, the first sensor pixel electrode SPE1 may be connected to the third connection pattern 600 through a contact hole CNT defined in the sixth insulating layer IL6. Similarly, each of the second sensor pixel electrode SPE2 and the third sensor pixel electrode SPE3 may also be connected to a conductive pattern disposed in (or directly on) a same layer as the third connection pattern 600 through a contact hole defined in the sixth insulating layer IL6.

In an embodiment, areas of the first sensor pixel electrode SPE1, the second sensor pixel electrode SPE2, and the third sensor pixel electrode SPE3 may be different from each other. In an embodiment, for example, the area of the first sensor pixel electrode SPE1 may greater than the area of the second sensor pixel electrode SPE2 and the area of the third sensor pixel electrode SPE3. The area of the third sensor pixel electrode SPE3 may be greater than the area of the second sensor pixel electrode SPE2.

In an embodiment, the shape and area of the first sensor pixel electrode SPE1 may be substantially the same as the shape and area of the first display pixel electrode DPE1, respectively. The shape and area of the second sensor pixel electrode SPE2 may be substantially the same as the shape and area of the second display pixel electrode DPE2, respectively. The shape and area of the third sensor pixel electrode SPE3 may be substantially the same as the shape and area of the third display pixel electrode DPE3, respectively.

The black patterns BP may include the first black pattern BPT, the second black pattern BP2, and the third black pattern BP3. The first black pattern BPT, the second black pattern BP2, and the third black pattern BP3 may disposed on the circuit layer CL, the first sensor pixel electrode SPE1, the second sensor pixel electrode SPE2, and the third sensor pixel electrode SPE3.

In an embodiment, the first black pattern BPT, the second black pattern BP2, and the third black pattern BP3 may include or be formed of an organic insulating material. In an embodiment, the first black pattern BPT, the second black pattern BP2, and the third black pattern BP3 may include a black component. In an embodiment, for example, the black component may be a black dye, a black pigment, or the like, and may include a metal (carbon black, chromium, or the like) or a metal oxide. The black patterns BP may be formed together with the pixel defining layer PDL and may include a same material as each other (e.g., formed through or during a same process using a same material).

In an embodiment, the black patterns BP may cover boundaries (or boundary areas) of the sensor pixel electrodes SPE, respectively. Here, the boundary areas of the sensor pixel electrodes SPE may be areas adjacent to ends of the sensor pixel electrodes SPE when viewed in a plan view. In an embodiment, for example, the first black pattern BPT may cover a boundary of the first sensor pixel electrode SPE1, the second black pattern BP2 may cover a boundary of the second sensor pixel electrode SPE2, and the third black pattern BP3 may cover a boundary of the third sensor pixel electrode SPE3. In such an embodiment, the black patterns BP may be respectively formed along the shapes of the boundaries of the sensor pixel electrodes SPE. Accordingly, a central portion of the first sensor pixel electrode SPE1, a central portion of the second sensor pixel electrode SPE2, and a central portion of the third sensor pixel electrode SPE3 may exposed by the first to third black patterns BP1, BP2, and BP3, respectively.

In an embodiment, the black patterns BP may expose the sensor area SA of the circuit layer CL. In an embodiment, for example, the first black pattern BP1, the second black pattern BP2, and the third black pattern BP3 may be disconnected from each other.

In an embodiment, each of the black patterns BP may include a first protrusion PP1 and a second protrusion PP2. The first protrusion PP1 may protrude in a first diagonal direction in a plan view, and the second protrusion PP2 may protrude in a second diagonal direction different from the first diagonal direction in the plan view. Here, the first diagonal direction and the second diagonal directions are directions diagonal with respect to the first and second directions D1 and D2.

In an embodiment, the first protrusion PP1 of each of the black patterns BP may overlap the contact hole CNT, and the second protrusion PP2 of each of the black patterns BP may overlap the first area A1 of the first active pattern 110. As the second protrusion PP2 overlaps the first area A1 of the first active pattern 110, leakage current of the display device 1000 may be reduced.

As described above, the second touch electrode TE2 of the touch layer TL may continuously extend from the display area DA to the sensor area SA. Alternatively, the first touch electrode TE1 of the touch layer TL may continuously extend from the display area DA to the sensor area SA.

In an embodiment, the second touch electrode TE2 may overlap the first protrusion PP1 and the second protrusion PP2 of each of the black patterns BP In this case, the second touch electrode TE2 may not overlap the black patterns BP of the remaining portions except for the first and second protrusions PP1 and PP2.

In an embodiment, the first area A1 of the first active pattern 110, the second protrusion PP2 of each of the black patterns BP, and the second touch electrode TE2 may overlap each other.

In an embodiment, a width of each of the black patterns BP may be set based on a predetermined transmittance of the sensor area SA. In such an embodiment, the transmittance of the sensor area SA may be determined based on a width of each of the black patterns BP. In an embodiment, for example, the first black pattern BPT may have a first width W1, the second black pattern BP2 may have a second width W2, and the third black pattern BP3 may have a third width W3. The first, second, and third widths W1, W2, and W3 may be equal to or different from each other.

In an embodiment, each of the first, second, and third widths W1, W2, and W3 may be in a range of about 5 μm to about 7 μm. If each of the first, second, and third widths W1, W2, and W3 is less than about 5 μm, tearing defects of the black patterns BP may occur. If each of the first, second, and third widths W1, W2, and W3 is greater than about 7 μm, transmittance of the sensor area SA may be excessively reduced.

In an embodiment where each of the first, second, and third widths W1, W2, and W3 is about 5 μm, the area of the first black pattern BPT may be approximately 975.6 μm², the area of the second black pattern BP2 may be about 723.5 μm², and the area of the third black pattern BP3 may be about 848.1 μm². In such an embodiment, the average area of the first, second, and third black patterns BPT, BP2, and BP3 may be about 849 μm² and may be about 40.6% of the area of the first pixel circuit PC1.

In an embodiment where each of the first, second, and third widths W1, W2, and W3 is about 7 μm, the area of the first black pattern BPT may be about 1073.1 μm², the area of the second black pattern BP2 may be about 795.8 μm², and the area of the third black pattern BP3 may be about 932.9 μm². In such an embodiment, the average of areas of the first, second, and third black patterns BPT, BP2, and BP3 may be about 933.9 μm² and may be about 44.7% of the area of the first pixel circuit PC1.

Referring to FIG. 10, the display pixel electrodes DPE and the sensor pixel electrodes SPE may be regularly arranged (or arranged in a predetermined pattern) on the circuit layer CL. The pixel defining layer PDL may cover boundaries the display pixel electrodes DPE and the display area DA of the circuit layer CL. The black patterns BP may cover boundaries of the sensor pixel electrodes SPE. In addition, the black patterns BP may be disconnected from each other. Accordingly, the sensor area SA of the circuit layer CL may be exposed by the black patterns BP.

FIG. 11 is a table showing transmittance of a display device according to a comparative example and a display device according to an embodiment of the invention.

Referring to FIG. 11, a display device according to the comparative example includes a transparent pixel defining layer and does not include black patterns. For example, the transparent pixel defining layer is formed on an entire surface of the display device according to the comparative example. In other words, the transparent pixel defining layer covers the display area and a sensor area of a circuit layer included in the display device according to the comparative example.

In the display device according to the comparative example, the open rate of the circuit layer CL was about 90.30%. In addition, transmittance in the sensor area SA of the display device with respect to light having a wavelength of about 550 nm according to the comparative example was about 1.72%, and transmittance in the sensor area SA of the display device with respect to light having a wavelength of about 940 nm according to the comparative example was about 2.77%.

The display device 1000 according to the embodiment of the invention includes the pixel defining layer PDL in the display area DA and the black patterns BP in the sensor area SA.

In the display device 1000 according to the embodiment of the invention, when each of the first, second, and third widths W1, W2, and W3 is about 5 μm, the open ratio of the circuit layer CL is about 7.40%. In addition, transmittance in the sensor area SA of the display device 1000 with respect to light having a wavelength of about 550 nm according to the embodiment of the invention was about 1.38%, and transmittance in the sensor area SA of the display device 1000 with respect to light having a wavelength of about 940 nm according to the embodiment of the invention was about 2.70%.

In the display device 1000 according to the embodiment of the invention, when each of the first, second, and third widths W1, W2, and W3 is about 5 μm, transmittance of about 1.38% or greater in the sensor area SA was secured.

In the display device 1000 according to the embodiment of the invention, when each of the first, second, and third widths W1, W2, and W3 is about 7 μm, the open ratio of the circuit layer CL is about 5.80%. In addition, transmittance in the sensor area SA of the display device 1000 with respect to light having a wavelength of about 550 nm according to the example was about 1.08%, and transmittance in the sensor area SA of the display device 1000 with respect to light having a wavelength of about 940 nm according to the example was about 1.72%.

In the display device 1000 according to the embodiment of the invention, when each of the first, second, and third widths W1, W2, and W3 is about 7 μm, transmittance of about 1.08% or greater in the sensor area SA was secured.

The display device 1000 according to an embodiment of the invention may include the circuit layer CL, the display pixel electrodes DPE, the sensor pixel electrodes SPE, the pixel definition layer PDL, and the black patterns BP. In such an embodiment, the display pixel electrodes DPE and the pixel defining layer PDL may be provided or formed in the display area DA, and the sensor pixel electrodes SPE and the black patterns BP may be provided or formed in the sensor area SA.

In such an embodiment, as the pixel defining layer PDL includes a black component, light may not be introduced into the circuit layer CL overlapping the display area DA. Accordingly, transistor characteristic of the pixel circuits PC included in the circuit layer CL may not deteriorate.

In such an embodiment, as the black patterns BP expose the sensor area SA of the circuit layer CL, transmittance of the sensor area SA may be greater than transmittance of the display area DA. Accordingly, the functional module FM disposed in the sensor area SA may operate more effectively.

Embodiments of the disclosure can be applied to various display devices, such as display devices for vehicles, ships and aircraft, portable communication devices, display devices for exhibition or information transmission, medical display devices, or the like, for example.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
 a substrate including a display area and a sensor area surrounded by the display area;
 a circuit layer disposed on the substrate and including a plurality of pixel circuits;

a plurality of display pixel electrodes disposed on the circuit layer and overlapping the display area;

a plurality of sensor pixel electrodes disposed on the circuit layer and overlapping the sensor area; and a plurality of black patterns disposed on the circuit layer and overlapping the sensor pixel electrodes, respectively, wherein the plurality of black patterns cover boundary areas of the sensor pixel electrodes, respectively, and expose at least a portion of the circuit layer, wherein each of the plurality of black patterns includes:

a first protrusion protruding in a first diagonal direction in a plan view; and a second protrusion protruding in a second diagonal direction different from the first diagonal direction in the plan view.

2. The display device of claim 1, wherein the plurality of black patterns are respectively disposed along the boundary areas of the sensor pixel electrodes.

3. The display device of claim 1, wherein adjacent black patterns of the plurality of black patterns are spaced apart from each other with a separation gap such that they do not directly contact one another.

4. The display device of claim 1, wherein a width of each of the plurality of black patterns is set based on a predetermined transmittance of the sensor area.

5. The display device of claim 4, wherein the width of each of the plurality of black patterns is greater than or equal to about 5 μm and less than or equal to about 7 μm.

6. The display device of claim 5, wherein an average of areas of the plurality of black patterns relative to an area of each of the pixel circuits is greater than or equal to about 40% more and less than or equal to about 45%.

7. The display device of claim 5, wherein the area of each of the pixel circuits is greater than or equal to about 2050 μm2 and less than or equal to about 3000 μm², and the average of the areas of the plurality of black patterns is greater than or equal to about 700 μm2 and less than or equal to about 1000 μm².

8. The display device of claim 1, wherein the sensor pixel electrodes include a first sensor pixel electrode and a second sensor pixel electrode, the black patterns include a first black pattern covering a boundary area of the first sensor pixel electrode and a second black pattern covering a boundary area of the second sensor pixel electrode, an area of the first sensor pixel electrode and an area of the second sensor pixel electrode are different from each other, and a width of the first black patterns and a width of the second black patterns are equal to each other.

9. The display device of claim 8, wherein an area of the first black pattern and an area of the second black pattern are different from each other.

10. The display device of claim 1, further comprising:

a pixel defining layer covering boundary areas of the display pixel electrodes, wherein the pixel defining layer further covers a portion of the circuit layer overlapping the display area, and the plurality of black patterns expose a portion of the circuit layer overlapping the sensor area.

11. The display device of claim 10, wherein the plurality of black patterns and the pixel defining layer are disposed in a same layer as each other.

12. The display device of claim 10, wherein the plurality of black patterns and the pixel defining layer include a black component.

13. The display device of claim 10, wherein a transmittance of the sensor area is greater than a transmittance of the display area.

14. The display device of claim 1, wherein the circuit layer includes:

an active pattern disposed on the substrate and including a first area, a second area, a first channel area, a second channel area, a third area, wherein the first area is positioned between the first channel area and the second channel area;

a first gate electrode disposed on the active pattern and overlapping the first channel area;

a second gate electrode disposed in a same layer as the first gate electrode and overlapping the second channel area;

a drain electrode disposed on the first and second gate electrodes and connected to the third area of the active pattern;

a first connection pattern disposed in a same layer as the drain electrode;

a second connection pattern disposed on the first connection pattern and connected to the first connection pattern; and a third connection pattern disposed on the second connection pattern and connected to the second connection pattern.

15. The display device of claim 14, wherein each of the sensor pixel electrodes is connected to the third connection pattern through a contact hole, and the first protrusion overlaps the contact hole and the second protrusion overlaps the first area of the active pattern.

16. The display device of claim 15, further comprising:

an encapsulation layer disposed on the display pixel electrodes; and a touch layer disposed on the encapsulation layer and including a touch electrode, wherein the touch electrode continuously extends from the display area and the sensor area, and the touch electrode overlaps the first protrusion and the second protrusion.

17. The display device of claim 16, wherein the first area of the active pattern, the second protrusion, and the touch electrode overlap each other.

18. The display device of claim 17, further comprising: an anti-reflection layer disposed on the touch layer.

19. The display device of claim 1, further comprising: a functional module disposed in the sensor area.

* * * * *